United States Patent
Lue et al.

(10) Patent No.: US 8,975,687 B2
(45) Date of Patent: Mar. 10, 2015

(54) NONVOLATILE MEMORY ARRAY WITH CONTINUOUS CHARGE STORAGE DIELECTRIC STACK

(75) Inventors: Hang-Ting Lue, Hsinchu (TW); Tzu-Hsuan Hsu, Jhongpu Township (TW); Sheng-Chih Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 437 days.

(21) Appl. No.: 12/813,906

(22) Filed: Jun. 11, 2010

(65) Prior Publication Data
US 2011/0303968 A1    Dec. 15, 2011

(30) Foreign Application Priority Data
Apr. 7, 2010 (TW) .............................. 99110784 A

(51) Int. Cl.
| | |
|---|---|
| H01L 29/76 | (2006.01) |
| H01L 29/792 | (2006.01) |
| G11C 16/04 | (2006.01) |
| H01L 21/28 | (2006.01) |
| H01L 27/115 | (2006.01) |
| H01L 29/423 | (2006.01) |
| H01L 29/51 | (2006.01) |
| H01L 29/66 | (2006.01) |
| H01L 21/265 | (2006.01) |

(52) U.S. Cl.
CPC .......... *H01L 29/792* (2013.01); *G11C 16/0483* (2013.01); *H01L 21/28282* (2013.01); *H01L 27/11568* (2013.01); *H01L 29/4234* (2013.01); *H01L 29/513* (2013.01); *H01L 29/518* (2013.01); *H01L 29/66833* (2013.01); *H01L 21/26513* (2013.01)
USPC .......................................... 257/324; 438/207

(58) Field of Classification Search
USPC ................. 257/314, 315, 318, 324, E21.679; 365/185; 438/201, 207
See application file for complete search history.

(56) References Cited

U.S. PATENT DOCUMENTS

| | | | |
|---|---|---|---|
| 6,750,157 B1 | 6/2004 | Fastow et al. | |
| 7,397,701 B2 | 7/2008 | Yeh et al. | |
| 7,417,895 B2 | 8/2008 | Cho | |
| 7,642,585 B2 | 1/2010 | Wang et al. | |
| 2001/0018253 A1* | 8/2001 | Nakamura et al. ............ 438/296 |

(Continued)

FOREIGN PATENT DOCUMENTS

| | | |
|---|---|---|
| CN | 1610976 A | 4/2005 |
| JP | 2003078051 A | 3/2003 |

(Continued)

OTHER PUBLICATIONS

Office Action mailed Sep. 21, 2012 in application No. CN 201010169880.7, 10pp.

(Continued)

*Primary Examiner* — Thomas L Dickey
(74) *Attorney, Agent, or Firm* — Kenta Suzue; Haynes Beffel & Wolfeld LLP

(57) ABSTRACT

An integrated circuit of an array of nonvolatile memory cells has a dielectric stack layer over the substrate, and implanted regions in the substrate under the dielectric stack layer. The dielectric stack layer is continuous over a planar region, that includes locations of the dielectric stack layer that store non-volatile data, such that these locations are accessed by word lines/bit lines.

18 Claims, 11 Drawing Sheets

(56) References Cited

U.S. PATENT DOCUMENTS

| | | |
|---|---|---|
| 2002/0005545 A1* | 1/2002 | Widdershoven et al. ..... 257/314 |
| 2003/0080370 A1* | 5/2003 | Harari et al. ................. 257/314 |
| 2006/0240617 A1 | 10/2006 | Torii |
| 2007/0297241 A1 | 12/2007 | Wu |
| 2008/0031046 A1* | 2/2008 | Liao ........................ 365/185.17 |
| 2008/0145985 A1* | 6/2008 | Chi .............................. 438/199 |
| 2008/0175053 A1 | 7/2008 | Lue et al. |
| 2008/0175069 A1 | 7/2008 | Wang et al. |
| 2010/0038698 A1 | 2/2010 | Lee |

FOREIGN PATENT DOCUMENTS

| | | | |
|---|---|---|---|
| JP | 2006-216215 A | | 8/2006 |
| JP | 2010512019 A | | 4/2010 |
| WO | 03038907 A1 | | 5/2003 |

OTHER PUBLICATIONS

Japanese Office Action dated Oct. 9, 2012 for Japanese Application No. 2010-156741.

JP Office Action mailed Jul. 9, 2013 in related application JP 2010-156741, 2 pp + 1p translation.

* cited by examiner

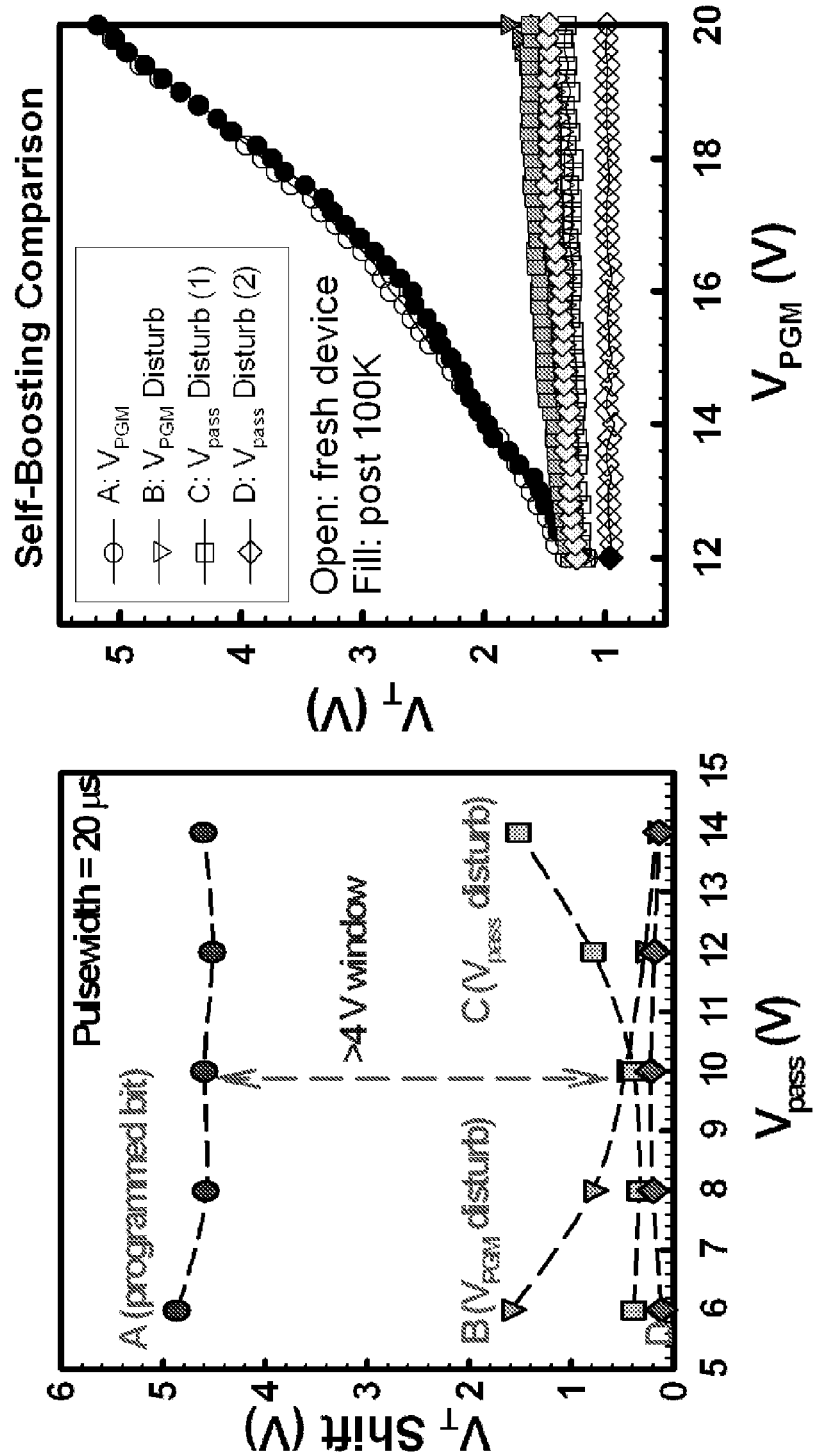

NONVOLATILE MEMORY ARRAY WITH CONTINUOUS CHARGE STORAGE DIELECTRIC STACK

BACKGROUND

1. Field of the Invention

The technology relates to nonvolatile memory, such as charge trapping nonvolatile memory, and in particular BE-SONOS nonvolatile memory.

2. Description of Related Art

A common process for manufacturing a nonvolatile memory integrated circuit with NAND columns, etches away the dielectric stack material between neighboring memory cells of a NAND column. Because the dielectric stack material is etched away, the subsequent implantation of junctions into the substrate between the neighboring memory cells is easy.

A common understanding is that charge will laterally migrate in a SiN trapping layer of the dielectric stack. Such lateral migration degrades the reliability of the data represented by the charge stored in the SiN trapping layer. Accordingly, it is an expected manufacturing process step, to etch away the dielectric stack between NAND columns and between neighboring memory cells of a NAND column. Such etching is expected to prevent lateral migration of the charge in the SiN trapping layer.

SUMMARY

One aspect of the technology is an apparatus, with an integrated circuit of an array of nonvolatile memory cells. The integrated circuit includes a substrate, word lines accessing the array of nonvolatile memory cells, bit lines accessing the array of nonvolatile memory cells, a dielectric stack layer over the substrate, and implanted regions in the substrate under the dielectric stack layer.

The array of nonvolatile memory cells stores nonvolatile data at locations of the dielectric stack layer, such that these locations are accessed by the word lines and the bit lines. The dielectric stack layer is continuous over a region that includes these locations.

The implanted regions in the substrate are under the dielectric stack layer. The implanted regions are positioned between the locations of the dielectric stack layer. In another embodiment, the implanted regions are positioned between two of the word lines.

In some embodiments, the junctions have junction depths shallow junctions, such as smaller than channel length. At the junction depths, the junctions have concentrations equal to a background concentration (e.g., of the substrate or well).

This technology has great, unexpected improvement in nonvolatile memory endurance.

In some embodiments, the nonvolatile memory cells of the array have an endurance of at least 100,000 program-and-erase cycles, such that after 100,000 program-and-erase cycles of the nonvolatile memory cells of the array, a threshold voltage of the nonvolatile memory cells of the array in a programmed state varies by no more than 0.3 V.

In some embodiments, the nonvolatile memory cells of the array have an endurance of at least 100,000 program-and-erase cycles, such that after 100,000 program-and-erase cycles of the nonvolatile memory cells of the array, a self-boosting disturb window of the nonvolatile memory cells is at least 4 V.

The unexpected improvement in the nonvolatile memory endurance is not based on a straightforward mechanism. The most important mechanism of endurance degradation comes from interface state generation (Nit). Nit occurs because of the a damaged interface between the silicon substrate and the dielectric stack, which generates dangling bonds. The dangling bonds are often related to the effect of hydrogen movement. For example, because the silicon-hydrogen bond is not a strong bond, dangling bonds that are decorated with hydrogen will break at relatively low temperatures, and the hydrogen diffuses out of the film. However, for a continuous dielectric stack, the nitride layer serves as a sealing layer to hydrogen. The hydrogen remains in the film, to help preserve the number of dangling bonds that are decorated with hydrogen.

In some embodiments, the continuous part of the dielectric stack layer blocks outward diffusion of hydrogen from the substrate.

In some embodiments, the nonvolatile memory cells of the array are arranged in NAND columns.

In some embodiments, the dielectric stack layer includes a tunneling dielectric layer, a charge trapping dielectric layer, and a blocking dielectric layer. The tunneling dielectric layer contacts "one of" a word line and a channel surface of the substrate. The charge trapping dielectric layer is between the tunneling dielectric layer and "another of" the word line and the channel surface. The blocking dielectric layer is between the charge trapping dielectric layer and "another of" the word line and the channel surface.

For example, the tunneling dielectric layer contacts a word line, the charge trapping dielectric layer is between the tunneling dielectric layer and the channel surface, and the blocking dielectric layer is between the charge trapping dielectric layer and the channel surface; or the tunneling dielectric layer contacts a channel surface of the substrate, the charge trapping dielectric layer is between the tunneling dielectric layer and the word line, and the blocking dielectric layer is between the charge trapping dielectric layer and the word line.

In one embodiment, the trapping layer is reliable SiN, with very "deep" traps to store the charges, such that charge does not laterally move.

In another embodiment, the tunneling dielectric layer includes: a first silicon oxide layer having a thickness no more than 15 angstroms, a silicon nitride layer having a thickness no more than 30 angstroms, and a second silicon oxide layer having a thickness no more than 35 angstroms.

One aspect of the technology is a method of forming a memory integrated circuit, the method comprising:
  providing a substrate of the memory integrated circuit;
  forming a dielectric stack layer of the memory integrated circuit over the substrate;
  forming word lines of the memory integrated circuit over the dielectric stack layer; and
  implanting junctions of the memory integrated circuit through the dielectric stack layer, such that the junctions are formed under a continuous part of the dielectric stack layer and between two of the word lines,
  wherein the memory integrated circuit has an array of nonvolatile memory cells storing nonvolatile data at locations of the dielectric stack layer, the locations arranged in columns accessed by a plurality of bit lines and arranged in rows accessed by the plurality of word lines, wherein the continuous part of the dielectric stack layer extends over a region including the locations of the array of nonvolatile memory cells accessed by the plurality of word lines and the plurality of bit lines.

Various embodiments are discussed herein.

One embodiment has an implantation energy of at least 20 keV.

One embodiment has an implantation dose of less than $10^{14}$ cm$^{-2}$

BRIEF DESCRIPTION OF THE DRAWINGS

FIG. 9 is a graph of threshold voltage shift (of the memory cell selected for programming, and the memory cells neighboring the selected memory cell) versus word line pass voltage for a program operation of the improved NAND memory according to FIG. 8, which consequently shows the self-boosting Vpass disturb window.

FIG. 10 is a graph of threshold voltage (of the fresh memory cell selected for programming, the post-100,000 cycle memory cell selected for programming, the fresh memory cells neighboring the selected memory cell, and the fresh memory cells neighboring the selected memory cell) versus word line program voltage for a program operation of the improved NAND memory according to FIG. 8.

DETAILED DESCRIPTION

Figure 1:
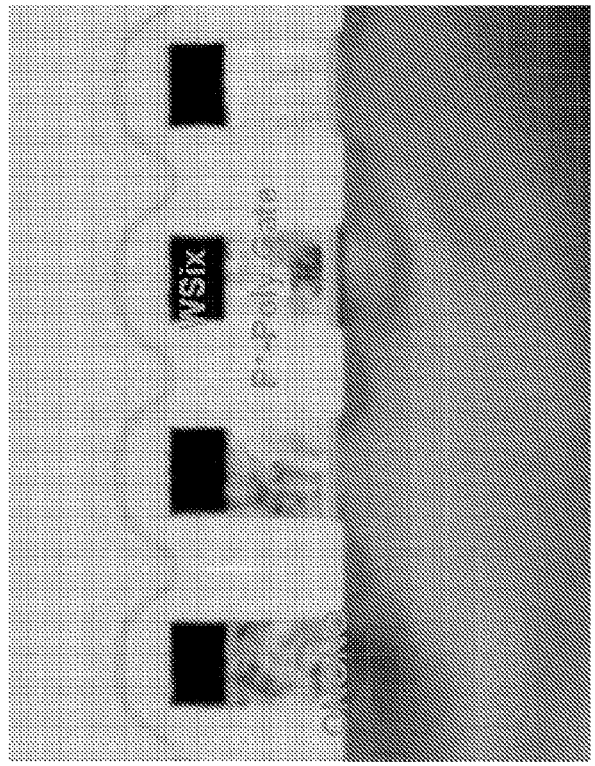
FIG. 1 shows a cross-section of a NAND column of nonvolatile memory, with the charge trapping dielectric stack material etched away between neighboring cells in the NAND column.

FIG. 1 shows a cross-section of a NAND column of nonvolatile memory, with the charge trapping dielectric stack material etched away between neighboring cells in the NAND column.

The etched away dielectric stack material, (e.g. ONO) provides easier junction implantation between the remaining dielectric stack material. For example, light-doped N+ implantation is facilitated.

Figure 2:
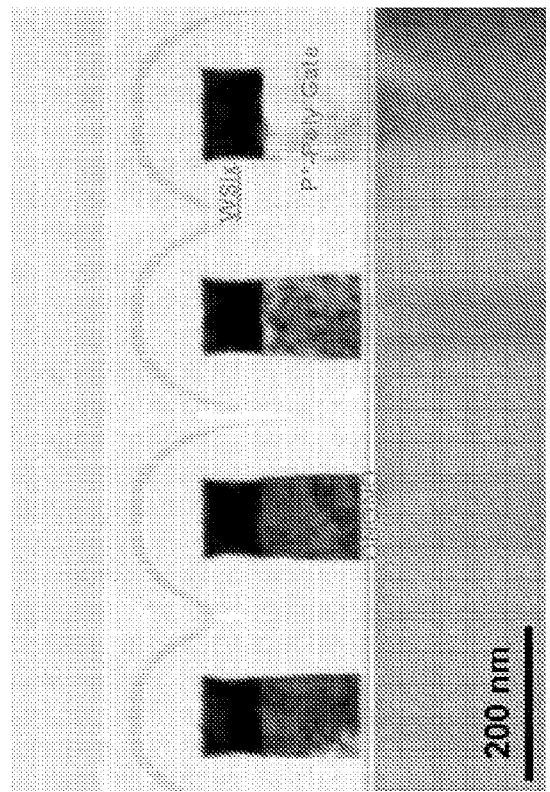
FIG. 2 shows a cross-section of a NAND column of nonvolatile memory, with continuous charge trapping dielectric stack material between neighboring cells in the NAND column.

FIG. 2 shows a cross-section of a NAND column of nonvolatile memory, with continuous charge trapping dielectric stack material between neighboring cells in the NAND column.

Although etching does not cut through the dielectric stack, junction implantation penetrates through the dielectric stack, and forms a shallow junction.

Figure 3:
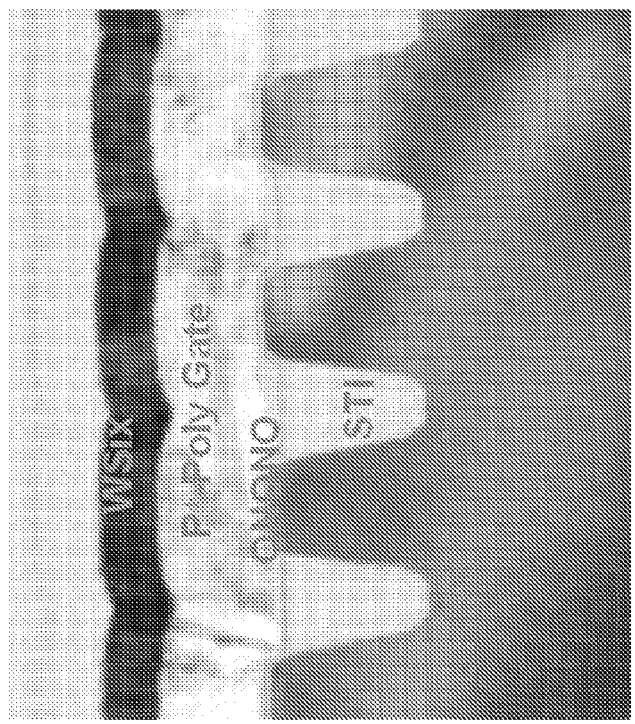
FIG. 3 shows a cross-section, viewed in the bit line direction extending into and out of the page, of multiple NAND columns of nonvolatile memory, with continuous charge trapping dielectric stack material between neighboring NAND columns.

FIG. 3 shows a cross-section, viewed in the bit line direction extending into and out of the page, of multiple NAND columns of nonvolatile memory, with continuous charge trapping dielectric stack material between neighboring NAND columns.

The cross-section shows continuous charge trapping dielectric stack material in the bit line direction. The continuous charge trapping dielectric stack material is planar. As shown in the figure, "planar" does not mean perfectly flat, but instead generally two dimensional, to account for the semiconductor manufacturing process (e.g., with etching, growth, and deposition).

Figure 4:
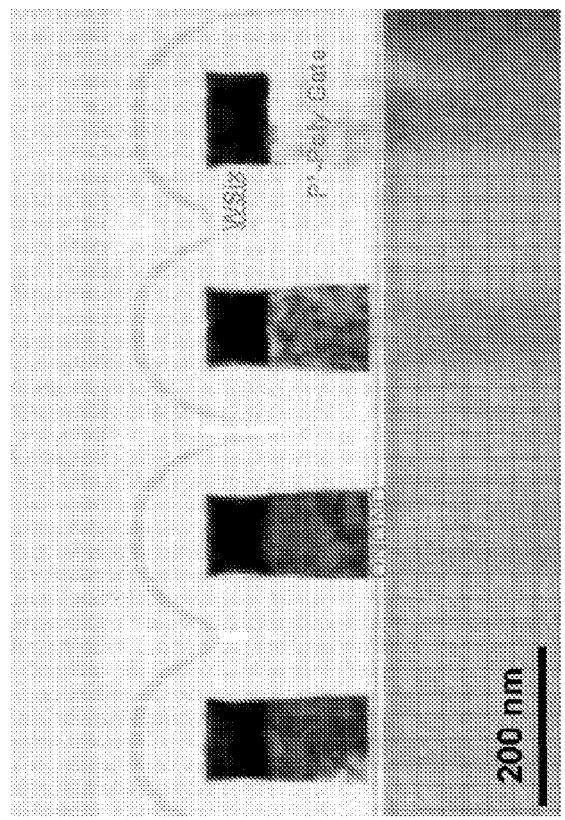
FIG. 4 shows a cross-section, viewed in the world line direction extending into and out of the page, of a NAND column of nonvolatile memory, with continuous charge trapping dielectric stack material between neighboring cells in the NAND column.

FIG. 4 shows a cross-section, viewed in the world line direction extending into and out of the page, of a NAND column of nonvolatile memory, with continuous charge trapping dielectric stack material between neighboring cells in the NAND column.

The cross-section shows continuous charge trapping dielectric stack material in the word line direction.

Figure 5:
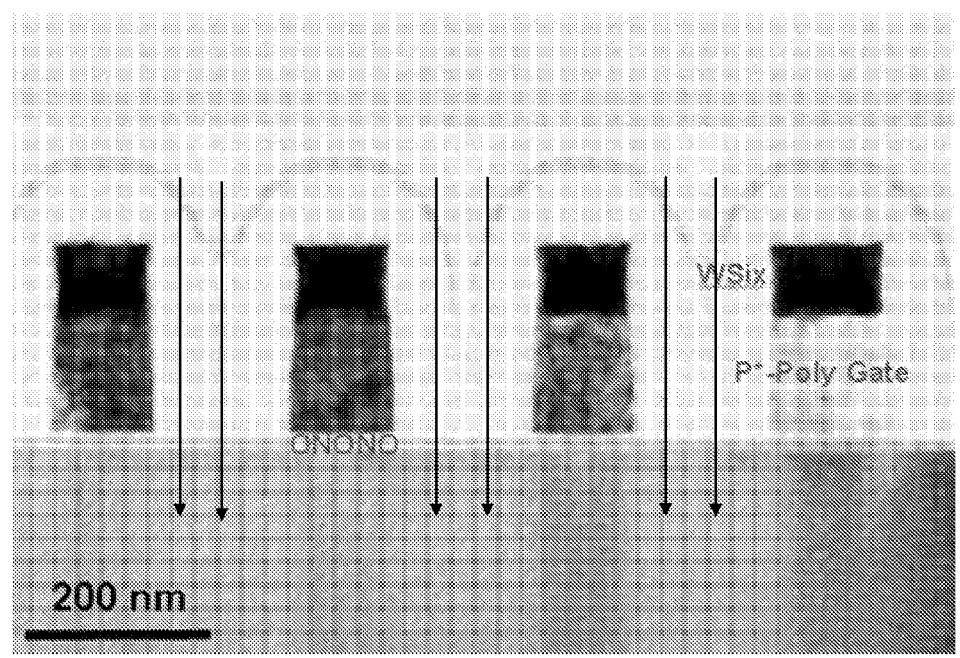
FIG. 5 shows the shallow junction implantation through the continuous charge trapping dielectric stack material between neighboring cells of a NAND column of nonvolatile memory.

FIG. 5 shows the shallow junction implantation through the continuous charge trapping dielectric stack material between neighboring cells of a NAND column of nonvolatile memory.

Typical junction implantation conditions are shown. The junction implantation energy must be high enough (e.g., >20 keV) to penetrate through the dielectric stack material (e.g. ONONO). Meanwhile, a shallower junction is preferred, because it provides better short-channel effects. The dosage is less than 1E14 cm−2 for the lightly-doped junction.

In the illustrated example, the implantation is As, energy: 30 KeV, dosage: 3E13 cm−2.

Such a very lightly-doped junction avoids damage to the ONO film. The lightly-doped junction is ideal in the NAND memory, which does not require a high read current. In CMOS logic, the lightly-doped junction may be less ideal and have to be more heavily doped.

Typically, the depth of a shallow junction is smaller than channel length. For example, for a 30 nm NAND flash device, the junction depth is shallower than 30 nm. Meanwhile, the junction doping is also lightly doped so that short-channel effects are improved. (For NAND flash, a good self-boosting is also required.)

Figure 6:
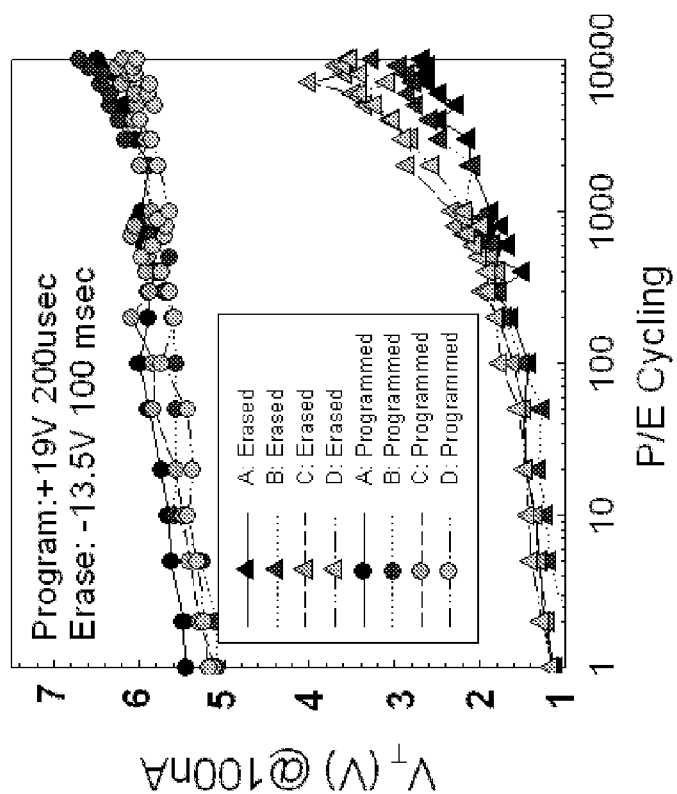
FIG. 6 is a graph of the program threshold voltage and the erase threshold voltage versus the number of program-and-erase cycles, for multiple NAND memory cells with charge trapping dielectric stack material etched away between neighboring memory cells.

FIG. 6 is a graph of the program threshold voltage and the erase threshold voltage versus the number of program-and-erase cycles, for multiple NAND memory cells with charge trapping dielectric stack material etched away between neighboring memory cells.

Figure 7:
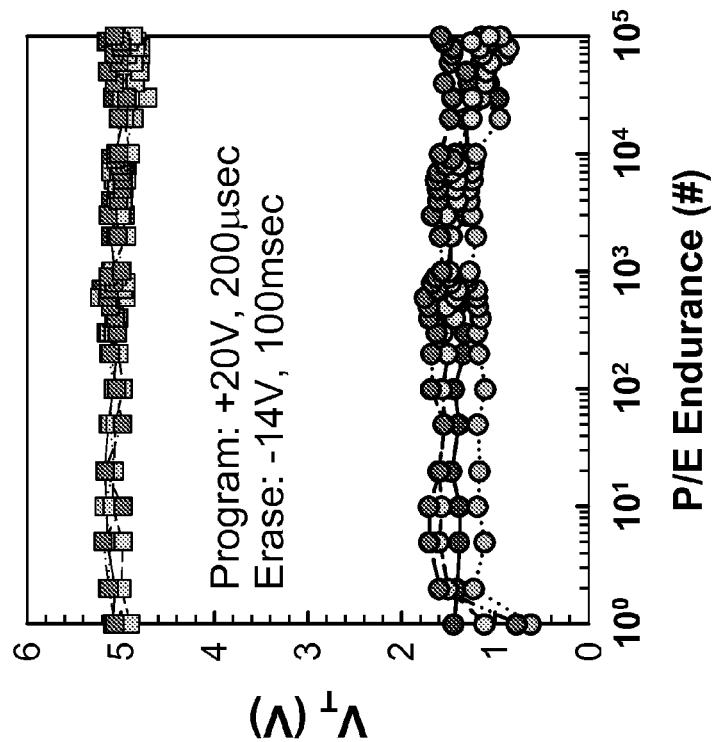
FIG. 7 is a graph of the program threshold voltage and the erase threshold voltage versus the number of program-and-erase cycles, for multiple NAND memory cells with continuous charge trapping dielectric stack material between neighboring memory cells.

FIG. 7 is a graph of the program threshold voltage and the erase threshold voltage versus the number of program-and-erase cycles, for multiple NAND memory cells with continuous charge trapping dielectric stack material between neighboring memory cells.

A comparison of FIGS. 6 and 7 shows an advantageous feature of embodiments of the technology. In FIG. 6, with four samples of NAND memory cells with charge trapping dielectric stack material etched away between neighboring memory cells, the threshold voltage of the erased state rises from about 1 V to about a range of 2.7 V to 3.7 V as the number of program-and-erase cycles rises from 1 cycle to 10000 cycles; and the threshold voltage of the programmed state rises from a range of about 5.1 V to 5.4 V to a range of about 6.0 V to 6.7 V as the number of program-and-erase cycles rises from 1 cycle to 10000 cycles. In FIG. 6, as the number of program-and-erase cycles rises from 1 cycle to 10000 cycles, the threshold voltages substantially rise, by a median of 2.2 V for the erased state and by a median of 1.1 V for the programmed state.

By contrast, in FIG. 7, with four samples of NAND memory cells with continuous charge trapping dielectric stack material between neighboring memory cells, the threshold voltage of the erased state changes from a range of about 0.6 V to 1.4 V to about a range of 0.8 V to 1.6 V as the number of program-and-erase cycles rises from 1 cycle to 10000 cycles; and the threshold voltage of the programmed state rises from a range of about 4.9 V to 5.1 V to a range of about 4.8 V to 5.2 V as the number of program-and-erase cycles rises from 1 cycle to 10000 cycles. In FIG. 7, despite the number of program-and-erase cycles rising from 1 cycle to 10000 cycles, the threshold voltages of the programmed state and the erased state are essentially constant.

Accordingly, a comparison of FIGS. 6 and 7 shows that the technology of multiple NAND memory cells with continuous charge trapping dielectric stack material between neighboring memory cells is associated with much more constant threshold voltage behavior as the number of program-and-erase cycles rises from 1 cycle to 10000 cycles.

Figure 8:
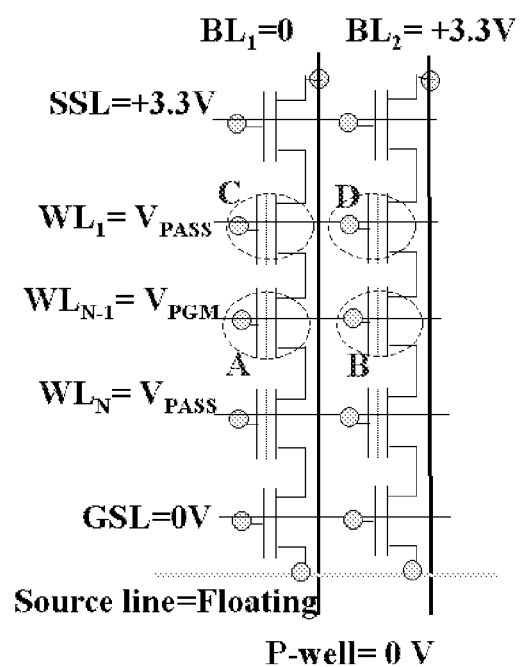
FIG. 8 is a simplified circuit diagram of a couple of neighboring NAND columns of nonvolatile memory, such that continuous charge trapping dielectric stack material is between the NAND columns and between neighboring cells in the NAND columns, undergoing programming of a selected memory cell according to the self-boosting method.

FIG. 8 is a simplified circuit diagram of a couple of neighboring NAND columns of nonvolatile memory, such that continuous charge trapping dielectric stack material is between the NAND columns and between neighboring cells in the NAND columns, undergoing programming of a selected memory cell according to the self-boosting method.

The SSL (source line) transistors are turned on and the GSL transistors are turned off. The bit line voltages for cells to be programmed are set to 0 V, while the bit line voltages for cells to be program inhibited are set to Vss. A 0 V bit line ties the channel of the associated unit NAND string to ground. When the program voltage is applied to the gate of the selected cell, the large potential difference between gate and channel results in F-N tunneling of electrons on to the floating gate, programming the cell. In program inhibited cells, the Vss bit line initially precharges the associated channel. When the word lines of the unit NAND string rise (selected word line to the program voltage and unselected word lines to the pass voltage), the series capacitances through the control gate, floating gate, channel, and bulk are coupled and the channel potential is boosted automatically.

FIG. 9 is a graph of threshold voltage shift (of the memory cell selected for programming, and the memory cells neighboring the selected memory cell) versus word line pass voltage for a program operation of the improved NAND memory according to FIG. 8, which consequently shows the self-boosting Vpass disturb window.

The self-boosting Vpass disturb window is the widest difference between the threshold voltage shift of the memory cell selected for programming, and the memory cells neighboring the selected memory cell.

Memory cell A corresponds to the memory cell selected for programming. Memory cell B corresponds to another memory cell which has the same word line as memory cell A, and which is in an adjacent NAND column that receives the program inhibited bit line voltage. Memory cell C corresponds to another memory cell which is in the same NAND column as memory cell A, and which has a word line receiving a pass voltage. Memory cell D corresponds to another memory cell which shares neither a NAND column with memory cell A, nor a word line with memory cell A.

Increased Vpass shows suppressed VPGM disturb, but increased Vpass disturb. Similarly, decreased Vpass shows increased VPGM disturb, but suppressed Vpass disturb. Vpass ~10 V is the optimized condition. The disturb-free memory window is more than 4V.

FIG. 10 is a graph of threshold voltage (of the fresh memory cell selected for programming, the post-100,000 cycle memory cell selected for programming, the fresh memory cells neighboring the selected memory cell, and the fresh memory cells neighboring the selected memory cell) versus word line program voltage for a program operation of the improved NAND memory according to FIG. 8.

The identifications of memory cells A, B, C, and D are the same as in FIG. 9. The post-100K cycle memory cell still shows a successful self-boosting disturb window.

The memory cell devices described above were implemented as SONOS type memory cells. Alternatively, the low-k spacers described can be implemented in other types of charge trapping memory cell arrays. For example, the low-k spacers can be implemented in Bandgap Engineered SONOS (BE-SONOS) devices. In one such embodiment, the tunneling layer 230 of the memory cells of FIG. 2A is replaced with a tunneling dielectric structure comprising a bottom dielectric layer of silicon dioxide less than 2 nm thick (such as about 1.3 nm), a middle dielectric layer of silicon nitride less than 2.5 nm thick (such as about 2 nm) on the bottom dielectric layer, and a top dielectric layer of silicon dioxide less than 3.5 nm thick (such as about 2.5 nm) on the middle dielectric layer. Other thicknesses can also be used. BE-SONOS technology has been proven to provide excellent performance, overcoming many of the erase speed, endurance and charge retention issues of prior art SONOS type memory.

For further information on BE-SONOS devices, attached hereto and incorporated by reference herein is U.S. patent application Ser. No. 12/182,318 entitled "High-K Capped Blocking Dielectric Bandgap Engineered SONOS and MONOS", filed on 30 Jul. 2008.

Figure 11:
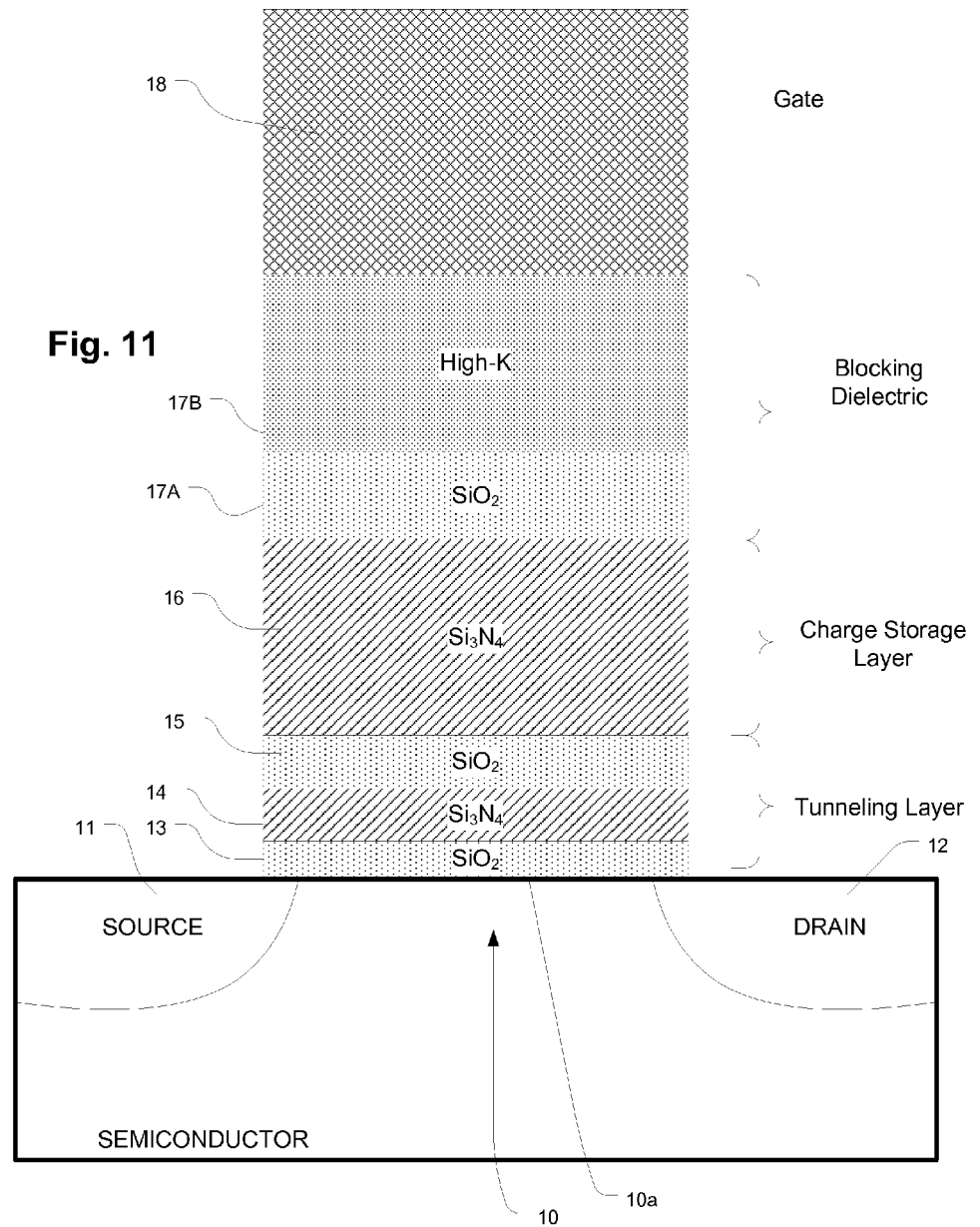
FIG. 11 is a simplified diagram of a BE-SONOS cell in the improved NAND array.

FIG. 11 is a simplified diagram of a BE-SONOS cell in the improved NAND array.

Shown is a charge trapping memory cell in the NAND array employing a multilayer blocking dielectric layer and a bandgap engineered dielectric tunneling layer. The memory cell includes a channel 10, a source 11 and a drain 12 adjacent the channel in a semiconductor body. A gate 18 overlies a multilayer stack, including the multilayer blocking dielectric layer, the charge trapping layer and the tunneling layer, of dielectric materials acting as the charge storage structure.

Gate 18 in this embodiment comprises p+ polysilicon. N+ polysilicon may also be used. Other embodiments employ metals, metal compounds or combinations of metals and metal compounds for the gate 18, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 11, the dielectric tunneling layer comprises a composite of materials, including a first layer 13, referred to as a hole tunneling layer, of silicon dioxide on the surface 10a of the channel 10 formed for example using in-situ steam generation ISSG with optional nitridation by either a post deposition NO anneal or by addition of NO to the ambient during deposition. The thickness of the first layer 13 of silicon dioxide is less than 20 Å, and preferably 15 Å or less. Representative embodiments are 10 Å or 12 Å thick.

A layer 14, referred to as a band offset layer, of silicon nitride lies on the first layer 13 of silicon oxide formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The thickness of the layer 14 of silicon nitride is less than 30 Å, and preferably 25 Å or less.

A second layer 15 of silicon dioxide, referred to as an isolation layer, lies on the layer 14 of silicon nitride formed for example using LPCVD high temperature oxide HTO deposition. The thickness of the second layer 15 of silicon dioxide is less than 35 Å, and preferably 25 Å or less. The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the engineered tunneling dielectric after the first location. This structure enables electric field assisted hole tunneling at high speeds while effectively preventing charge leakage through the engineered tunneling dielectric in the absence of electric fields or in the presence of smaller electric fields induced for the purpose of other operations, such as reading data from the cell or programming adjacent cells.

In a representative device, the engineered tunneling dielectric layer consists of an ultrathin silicon oxide layer O1 (e.g. <=18 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

Embodiments of the memory cell described herein include gates comprising polysilicon, such as n+ polysilicon, or metal, such as aluminum. In alternatives, the gates comprise materials having work functions that are greater than the work functions of n+ polysilicon, including for example, p+ polysilicon, platinum, tantalum nitride, and other materials chosen for work function, conductivity and manufacturability.

The structure of the dielectric tunneling layer is described in more detail below with reference to FIGS. 12 and 13.

A charge trapping layer 16 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials are described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer in this embodiment comprises a stack including a buffer layer 17A and a high-κ capping layer 17B. High-κ herein refers to dielectric constant >7, such as found in materials including $Al_2O_3$, $HfO_2$, $ZrO_2$, $La_2O_3$, AlSiO, HfSiO and ZrSiO etc.

The buffer layer of silicon dioxide can be formed by wet conversion from the nitride by a wet furnace oxidation process. Other embodiments may be implemented using high temperature oxide (HTO) or LPCVD $SiO_2$. An aluminum oxide capping dielectric layer can be made by atomic vapor deposition, with a post rapid thermal anneal at about 900° for 60 seconds to strengthen the film.

Using these processes, a layer of silicon oxide can be formed with very few defects, and a capping layer of high-κ, high conduction band offset material like aluminum oxide, combine to provide a blocking dielectric layer which provides excellent retention characteristics and very low erase saturation voltages. Therefore, the EOT can be reduced and the operation voltage can be lowered.

In a representative embodiment, the first layer 13 can be 13 Å of silicon dioxide; the band offset layer 14 can be 20 Å of silicon nitride; the isolation layer 15 can be 25 Å of silicon dioxide; the charge trapping layer 16 can be 70 Å of silicon nitride; and the blocking dielectric layer 17A,17B can be of silicon oxide between 5 Å and 90 Å, with a capping layer of aluminum oxide between 5 and 90 Å The gate material can be p+ polysilicon (work function about 5.1 eV). For improved retention characteristics, it is preferred that the layer of silicon oxide have a thickness greater than 30 Å.

Also, it is found that the ratio of the thickness of the top layer 17B to the thickness of the bottom layer 17A of the blocking dielectric layer can be less than 2 for the combination of silicon oxide ($\kappa_1$=3.9) and aluminum oxide ($\kappa_2$=about 8). In general, the top layer 17B can have a thickness that is less that the ratio of the dielectric constants (8/3.9) times the thickness of the bottom layer 17A. Thus, the blocking dielectric layer as described herein includes a first layer 17A having a dielectric constant $\kappa_1$ contacting the charge trapping dielectric layer and a second layer 17B contacting another one of the channel surface and the gate, the second layer 17B having a dielectric constant $\kappa_2$ higher than $\kappa_1$ of the first layer, and the second layer having thickness less than $\kappa_2/\kappa_1$ times that of the first layer. For aluminum oxide as a top capping layer, the dielectric constant is ~8 and the barrier height or conduction band offset is more than 3 eV to obtain the erase saturation $V_{FB}<-2V$. Since the barrier height of $Al_2O_3$ is almost the same as $SiO_2$, the electron barrier height or conduction band offset of aluminum oxide with N+ polysilicon gate is about 3.1 eV.

In examples of memory cells described herein, in order to get a reasonable operation speed (program and erase) at a voltage of less than 20 volts, the total effective oxide thickness EOT for the multilayer dielectric stack (e.g., High-k-O—N—O—N—O, and High-k-O—N—O) between the gate and the channel should be less than 160 Å. The EOT of a bandgap engineered (BE) ONO tunneling barrier or a single layer $SiO_2$ tunnel oxide is typically in a range of about 40 to 55 Å, and preferably 45 to 50 Å and the EOT of a nitride charge trapping layer is typically in a range of about 25 to 40 Å, and preferably 30 to 35 Å. Therefore, the EOT for the multilayer blocking dielectric layer (e.g. $SiO_2$ buffer layer and $Al_2O_3$) is less than 95 Å, and preferably in a range of about 75 to 85 Å, for the memory cells described herein.

Figure 12:
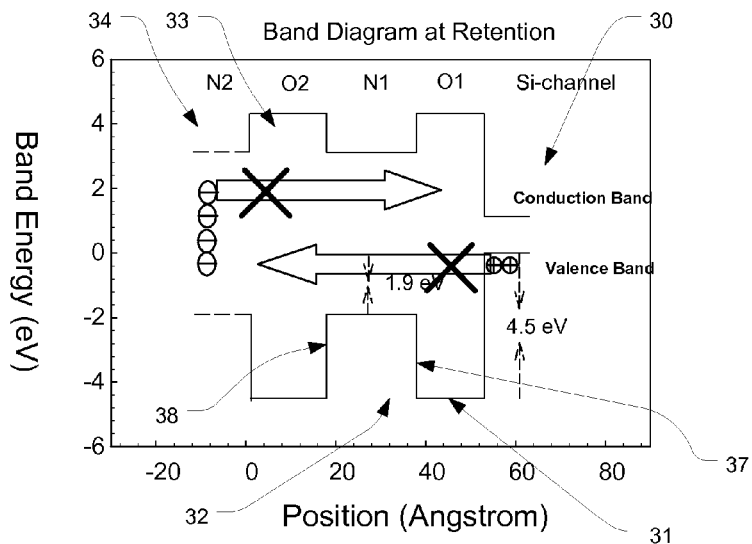
FIG. 12 is a band diagram for a tunneling dielectric layer of a BE-SONOS cell as in FIG. 11, including band offset technology at low electric fields.

FIG. 12 is a band diagram for a tunneling dielectric layer of a BE-SONOS cell as in FIG. 11, including band offset technology at low electric fields.

Shown is a diagram of the energy levels of the conduction and valence bands of the dielectric tunneling structure including the stack of layers 13-15 of FIG. 11 under a low electric field, showing a "U-shaped" conduction band and an "inverted U-shaped" valence band. From the right side, the bandgap for the semiconductor body is shown in region 30, the valence and conduction bands for the hole tunneling layer are shown in region 31, the bandgap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer (region 34), and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three regions 31, 32, 33 of the tunneling dielectric structure remains significantly below the valence band in the channel region 30. The tunneling layer described herein therefore is characterized by band offset characteristics, include a relatively large hole tunneling barrier height in a thin layer (region 31) at the interface with the semiconductor body, and an increase 37 in valence band energy level at a first location spaced less than 2 nm from the channel surface. The band offset characteristics also include a decrease 38 in valence band energy level at a second location spaced from the channel by providing a thin layer (region 33) of relatively high tunneling barrier height material, resulting in the inverted U-shaped valence band shape. Likewise, the conduction band has a U-shape caused by the same selection of materials.

Figure 13:
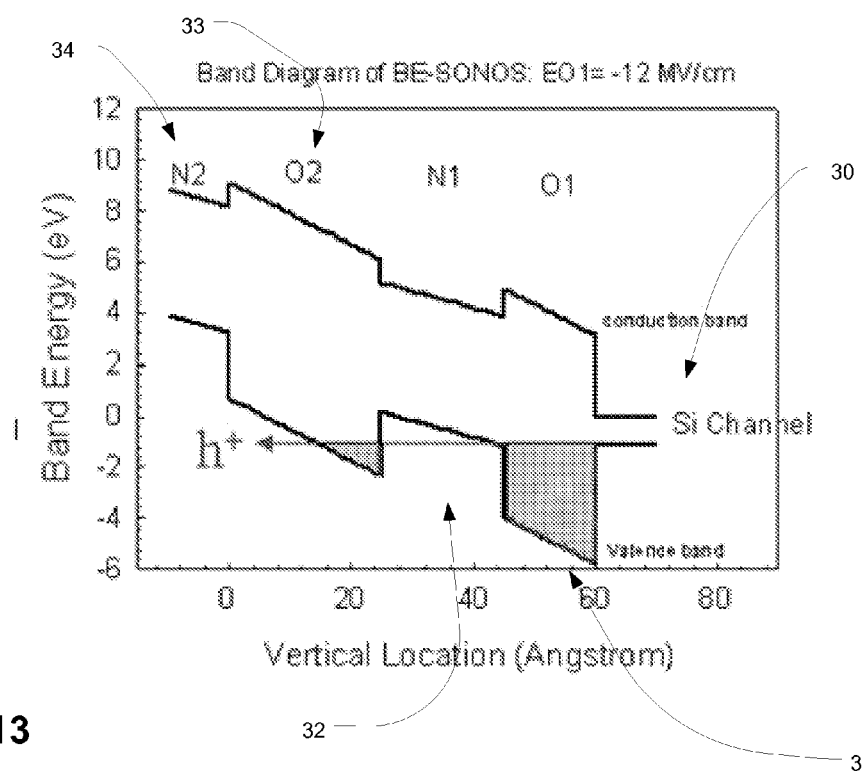
FIG. 13 is a band diagram for a tunneling dielectric layer of a BE-SONOS cell as in FIG. 11, including band offset technology at high electric fields.

FIG. 13 is a band diagram for a tunneling dielectric layer of a BE-SONOS cell as in FIG. 11, including band offset technology at high electric fields.

Shown are the band diagram for the dielectric tunneling structure under conditions of an electric field of about −12 MV/cm in the tunneling region 31, for the purposes of inducing hole tunneling (in FIG. 13, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in FIG. 13) between the level of the valence band in the channel and above the sloped, inverted U-shaped valence band in the tunneling stack is reduced. The band offset effectively eliminates the blocking function of the offset layer in region 32 and isolation layer in region 33 from the tunneling dielectric during high electric field allowing a large hole tunneling current under relatively small electric fields (e.g. E<14 MV/cm).

The isolation layer (region 33) isolates the offset layer 32 from a charge trapping layer (region 34). This increases the effective blocking capability during low electric field for both electrons and holes, improving charge retention.

The offset layer 32 in this embodiment must be thin enough that it has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling region 31, for an embodiment employing silicon dioxide, should be less than 20 Å thick, and more preferably less than 15 Å thick. For example, in a preferred embodiment, the hole tunneling region 31 is silicon dioxide about 13 Å or 10 Å thick, and exposed to a nitridation process as mentioned above resulting in an ultrathin silicon oxynitride.

The tunneling dielectric layer can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using bandgap engineering.

In alternatives, the multilayer tunneling stack may be replaced with a single layer tunneling oxide as used in conventional MONOS devices, or with other tunneling layer structures. It is known that although the conventional MONOS (tunneling oxide>3 nm) has good data retention, its erase saturation level is too high for NAND application because the SiO$_2$ top oxide cannot well suppress the gate injection.

MANOS/TANOS were proposed as referred to above. These structures use an Al$_2$O$_3$ (k~8) to replace the top oxide (k=3.9). The erase saturation is greatly suppressed, therefore, MANOS device has lower erase saturation level and larger memory window than MONOS. However, the use of a single high-κ top dielectric may introduce new reliability issues. This is because the high-κ dielectric is often more leaky than the conventional SiO$_2$ top oxide. Therefore, the use of a single, high-κ top dielectric does not provide retention reliability.

As described herein, an additional high-κ capping film is capped on the top oxide of MONOS. This new structure has good retention and read disturbance characteristics because the buffer layer has a low leakage current and can form the deep traps in the interface between trapping layer (SiN) and buffer layer (SiO$_2$). Also, the top high-κ film can suppress the gate injection because of its high dielectric constant, so that this new innovation can get a low erase saturation level and large memory window, which are good for NAND flash applications.

Figure 14:
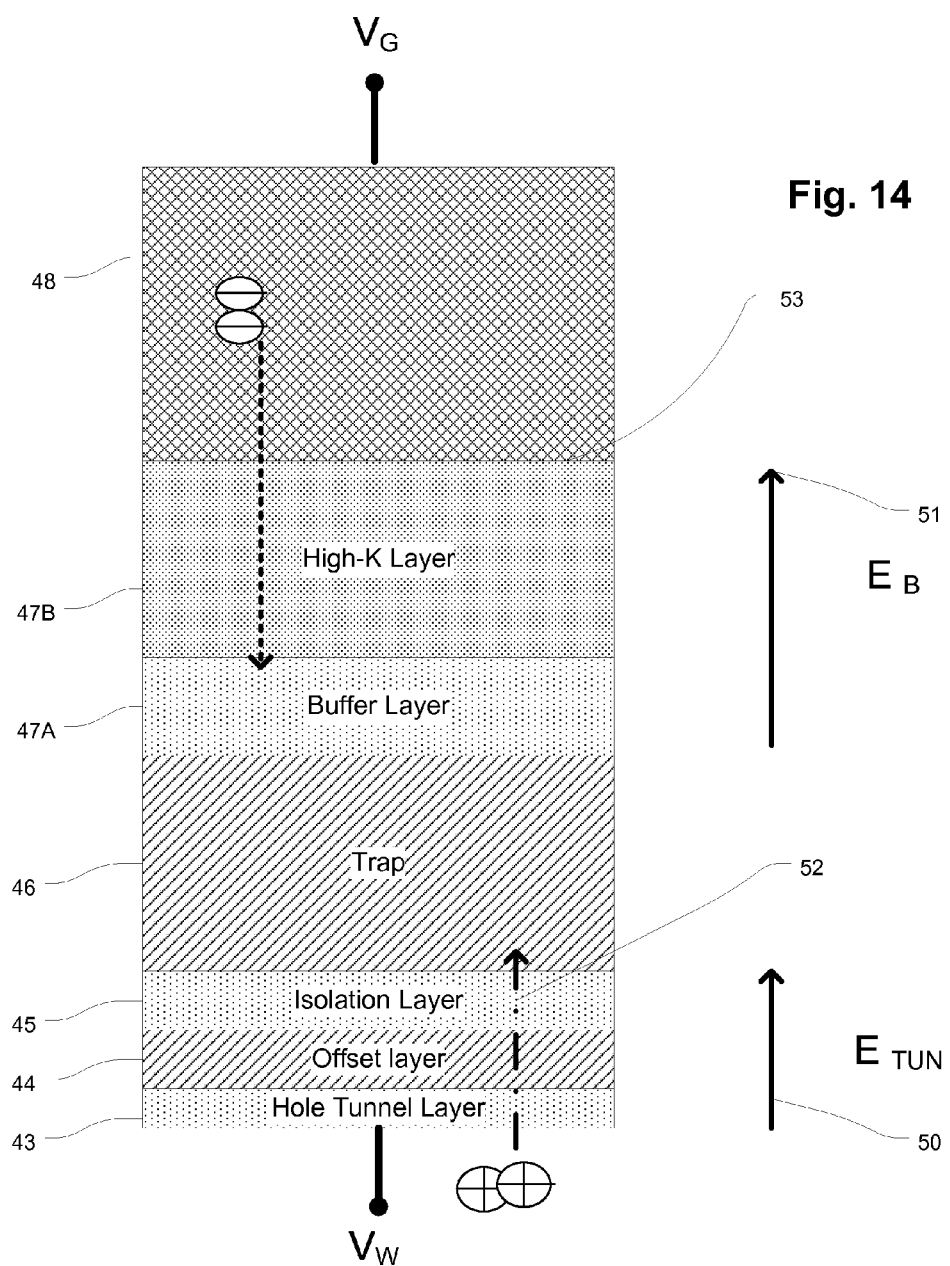
FIG. 14 illustrates the electric fields and tunneling currents of a BE-SONOS cell as in FIG. 11, during an erase operation for an embodiment of a memory cell.

FIG. 14 illustrates the electric fields and tunneling currents of a BE-SONOS cell as in FIG. 11, during an erase operation for an embodiment of a memory cell.

The schematic illustration of the gate stack shows electric field dynamics during an erase process. The gate stack includes a hole tunneling layer 43, a band offset layer 44, and an isolation layer 45 which in combination act as the dielectric tunneling layer for the device. A charge trapping layer 46 is shown on the tunneling dielectric layer. A blocking dielectric layer consisting of a multilayer structure including a buffer layer 47A and a capping layer 47B separates the charge trapping layer 46 from the gate 48. During an erase process, the electric field is induced by bias voltages V$_G$ and V$_W$ applied at the gate and channel of the memory cell, and results in an electric field E$_{TUN}$ 50 through the dielectric tunneling layer 43, 44, 45 and an electric field E$_B$ 51 through the blocking layer 47A/47B. The magnitude of the electric field E$_{TUN}$ 50 through the dielectric tunneling layer is sufficient to induce hole tunneling current 52 into the trapping layer 46. The magnitude of the electric field E$_B$ 51 through the capping layer 47B in the blocking dielectric layer is reduced relative to that through the silicon dioxide in the tunneling dielectric layer because of the higher dielectric constant by an amount that is about 3.9/κ, where 3.9 is the dielectric constant for silicon dioxide and κ is the dielectric constant of the capping layer 47B. Therefore, because of sufficient electron affinity of the gate 48, the relatively lower electric field E$_B$ 51 and the thickness of the blocking dielectric layer 47A/47B, electron tunneling current 53 is effectively blocked, allowing large memory windows without erase saturation effects. Memory devices as taught herein are operable with bias voltages across the gate and semiconductor body low enough that a maximum electric field of 14 MV/cm or less occurs in the tunneling dielectric layer during erase, with a corresponding lower electric field in the blocking dielectric layer.

Figure 15A:
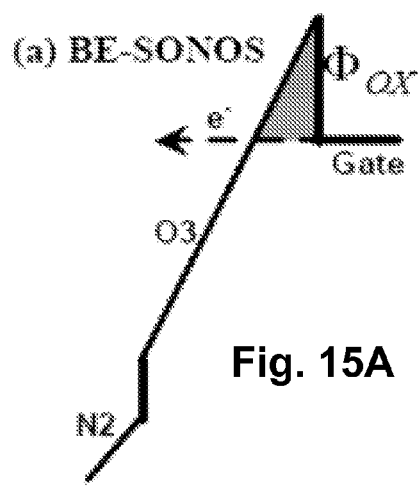
FIGS. 15A through 15D are conduction band diagrams for the blocking dielectric layer, of a BE-SONOS cell as in FIG. 11, of a single silicon dioxide layer (FIG. 15A), a single aluminum oxide layer (FIG. 15B), a first example stacked silicon dioxide/aluminum oxide layer (FIG. 15C), and a second example stacked silicon dioxide/aluminum oxide layer having a thicker aluminum oxide layer than the first example (FIG. 15D).
Figure 15B:
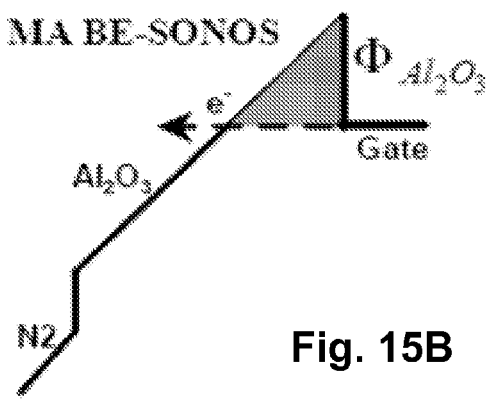
Figure 15C:
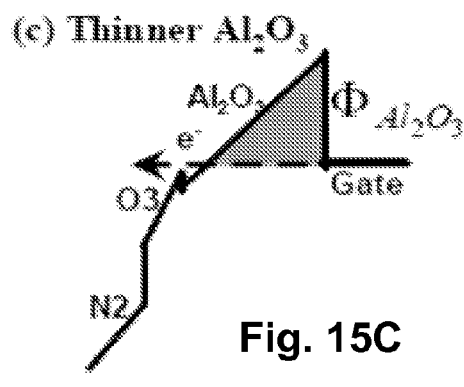
Figure 15D:
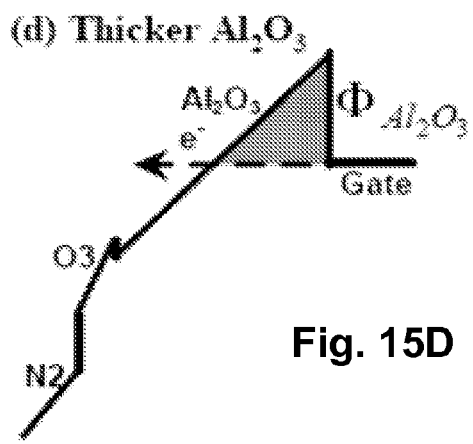

FIGS. 15A through 15D are conduction band diagrams for the blocking dielectric layer, of a BE-SONOS cell as in FIG. 11, of a single silicon dioxide layer (FIG. 15A), a single aluminum oxide layer (FIG. 15B), a first example stacked silicon dioxide/aluminum oxide layer (FIG. 15C), and a second example stacked silicon dioxide/aluminum oxide layer having a thicker aluminum oxide layer than the first example (FIG. 15D).

The tunneling probability for electron injection from the gate can be understood from these figures. The magnitude of the electric field within the material is reflected by the slope of the conduction band. Thus, the region corresponding to the silicon dioxide buffer layer labeled O3 in FIGS. 15C and 15D has a greater slope than the region corresponding to the aluminum oxide capping layer. The conduction band offset at the gate interface is reflected by the height of the step in the conduction band. For a bandgap engineered SONOS device as shown in FIG. 15A, the tunneling probability is relatively high, even though the conduction band offset is relatively large because of the high magnitude of the electric field. For an embodiment having an aluminum oxide blocking dielectric layer as represented in FIG. 15B, the tunneling probability is relatively low because of the lower slope on the conduction band caused by the relatively high dielectric constant (e.g. greater than 7), and because the conduction band offset remains relatively high (e.g. greater than 3 eV). FIGS. 15C and 15D suggest that the tunneling probability for gate injection is about the same for multilayer stacks having a silicon dioxide buffer layer and an aluminum oxide top layer, so long as the thickness of the aluminum oxide top layer is larger than a minimum value. Thus, the tunneling probability for the embodiment FIG. 15C having a thinner aluminum oxide layer is about the same as that for the embodiment of FIG. 15D having a thicker aluminum oxide layer.

Figure 16:
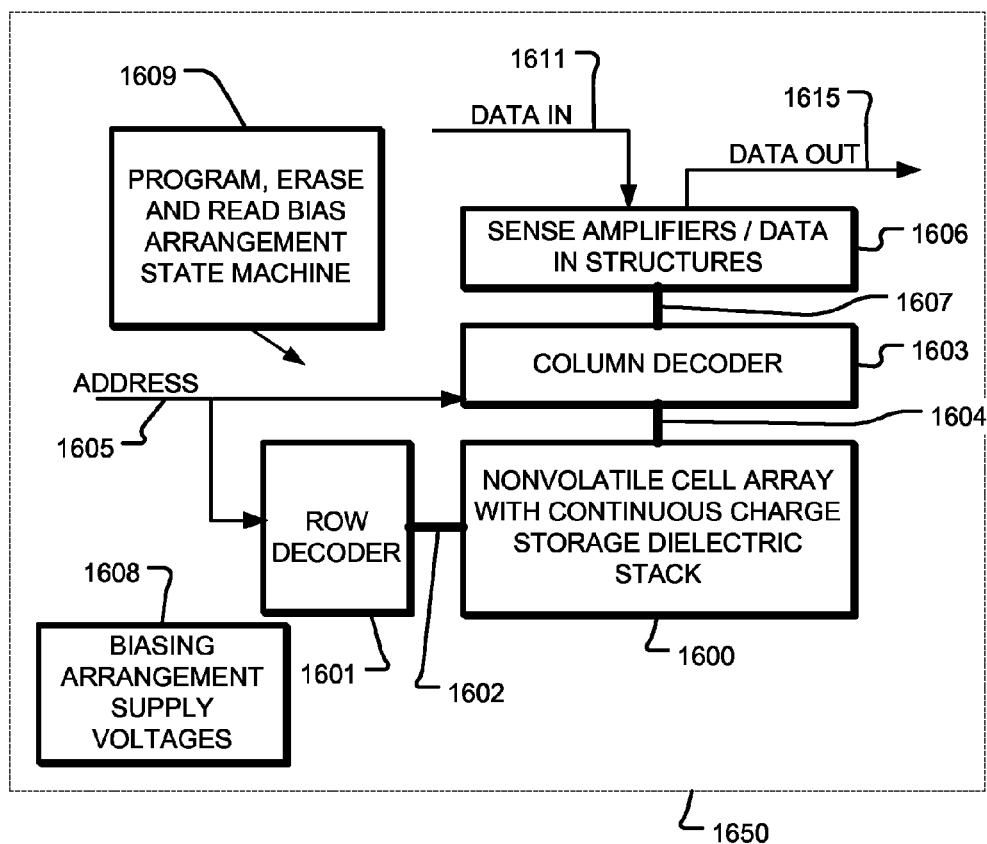
FIG. 16 is a simplified block diagram of an integrated circuit including a memory array implemented using improved NAND columns as described herein.

FIG. 16 is a simplified block diagram of an integrated circuit including a memory array implemented using improved NAND columns as described herein. An integrated circuit 1650 including a memory array 1600 is implemented using improved NAND columns as described herein. A word line (or row) and block select decoder 1601 is coupled to, and in electrical communication with, a plurality 1602 of word lines and string select lines, and arranged along rows in the memory array 1600. A bit line (column) decoder and drivers 1603 are coupled to and in electrical communication with a plurality of bit lines 1604 arranged along columns in the memory array 1600 for reading data from, and writing data to, the memory cells in the memory array 1600. Addresses are supplied on bus 1605 to the word line decoder and drivers 16001 and to the bit line decoder 1603. Sense amplifiers and data-in structures in block 1606, including current sources for the read, program and erase modes, are coupled to the bit line decoder 1603 via the bus 1607. Data is supplied via the data-in line 1611 from input/output ports on the integrated circuit 1650, to the data-in structures in block 1606. Data is supplied via the data-out line 1615 from the sense amplifiers in block 1606 to input/output ports on the integrated circuit 1650, or to other data destinations internal or external to the integrated circuit 1650.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
an integrated circuit including an array of nonvolatile memory cells, the integrated circuit comprising:
a substrate;
a plurality of word lines accessing the array of nonvolatile memory cells;
a plurality of bit lines accessing the array of nonvolatile memory cells;
a dielectric stack layer over the substrate, the array of nonvolatile memory cells storing nonvolatile data at locations of the dielectric stack layer accessed by the plurality of word lines and the plurality of bit lines, the dielectric stack layer continuous between adjacent word lines of the plurality of word lines of memory cells between a bit line and a source line over a region including the locations of the array of nonvolatile memory cells accessed by the plurality of word lines and the plurality of bit lines;
implanted regions in the substrate under the dielectric stack layer, the implanted regions positioned between the locations of the dielectric stack layer, including junctions having junction depths shorter than channel length of the nonvolatile memory cells, and at the junction depths the junctions have concentrations equal to a background concentration of the substrate; and
control circuitry performing operations on the array.

2. The apparatus of claim 1, wherein the nonvolatile memory cells of the array have an endurance of at least 100,000 program-and-erase cycles, such that after 100,000 program-and-erase cycles of the nonvolatile memory cells of the array, a threshold voltage of the nonvolatile memory cells of the array in a programmed state varies by no more than 0.3 V.

3. The apparatus of claim 1, wherein the nonvolatile memory cells of the array have an endurance of at least 100,000 program-and-erase cycles, such that after 100,000 program-and-erase cycles of the nonvolatile memory cells of the array, a self-boosting disturb window of the nonvolatile memory cells is at least 4 V.

4. The apparatus of claim 1, wherein the nonvolatile memory cells of the array are arranged in a plurality of NAND columns.

5. The apparatus of claim 1, wherein the continuous part of the dielectric stack layer blocks outward diffusion of hydrogen from the substrate.

6. The apparatus of claim 1, wherein said dielectric stack layer includes:
a tunneling dielectric layer contacting one of a word line of the plurality of word lines and a channel surface of the substrate;
a charge trapping dielectric layer between the tunneling dielectric layer and another of the word line of the plurality of word lines and the channel surface; and
a blocking dielectric layer between the charge trapping dielectric layer and said another of the a word line of the plurality of word lines and the channel surface.

7. The apparatus of claim 1, wherein said dielectric stack layer includes:
a tunneling dielectric layer contacting one of a word line of the plurality of word lines and a channel surface of the substrate, including:
a first silicon oxide layer having a thickness no more than 15 angstroms;
a silicon nitride layer having a thickness no more than 30 angstroms; and
a second silicon oxide layer having a thickness no more than 35 angstroms;
a charge trapping dielectric layer between the tunneling dielectric layer and another of the word line of the plurality of word lines and the channel surface; and
a blocking dielectric layer between the charge trapping dielectric layer and said another of the word line of the plurality of word lines and the channel surface.

8. A method of forming a memory integrated circuit, the method comprising:
providing a substrate of the memory integrated circuit;
forming a dielectric stack layer of the memory integrated circuit over the substrate;
forming word lines of the memory integrated circuit over the dielectric stack layer; and
implanting junctions of the memory integrated circuit through the dielectric stack layer, such that the junctions are formed under a continuous part of the dielectric stack layer and between two of the word lines, the junctions having junction depths shorter than channel length of nonvolatile memory cells, and at the junction depths the junctions have concentrations equal to a background concentration of the substrate,
wherein the memory integrated circuit has an array of the nonvolatile memory cells storing nonvolatile data at locations of the dielectric stack layer, the locations arranged in columns accessed by a plurality of bit lines and arranged in rows accessed by the plurality of word lines, wherein the continuous part of the dielectric stack layer extends between adjacent word lines of the plurality of word lines of memory cells between a bit line and a source line over a region including the locations of the array of the nonvolatile memory cells accessed by the plurality of word lines and the plurality of bit lines.

9. The method of claim 8, wherein the nonvolatile memory cells of the array have an endurance of at least 100,000 program-and-erase cycles, such that after 100,000 program-and-erase cycles of the nonvolatile memory cells of the array, a threshold voltage of the nonvolatile memory cells of the array in a programmed state varies by no more than 0.3 V.

10. The method of claim 8, wherein the nonvolatile memory cells of the array have an endurance of at least 100,000 program-and-erase cycles, such that after 100,000 program-and-erase cycles of the nonvolatile memory cells of the array, a self-boosting disturb window of the nonvolatile memory cells is at least 4 V.

11. The method of claim 8, wherein said implanting has an implantation energy of at least 20 keV.

12. The method of claim 8, wherein said implanting has an implantation dose of less than $10^{14}$ cm$^{-2}$.

13. The method of claim 8, wherein the nonvolatile memory cells of the array are arranged in a plurality of NAND columns.

14. The method of claim 8, wherein the continuous part of the dielectric stack layer blocks outward diffusion of hydrogen from the substrate.

15. The method of claim 8, wherein said forming the dielectric stack layer, includes:
forming a tunneling dielectric layer contacting one of a word line of the plurality of word lines and a channel surface of the substrate;
forming a charge trapping dielectric layer between the tunneling dielectric layer and another of the word line of the plurality of word lines and the channel surface; and forming a blocking dielectric layer between the charge trapping dielectric layer and said another of the word line of the plurality of word lines and the channel surface.

16. The method of claim 8, wherein said forming the dielectric stack layer, includes:
    forming a tunneling dielectric layer contacting one of a word line of the plurality of word lines and a channel surface of the substrate, including:
        forming a first silicon oxide layer having a thickness no more than 15 angstroms;
        forming a silicon nitride layer having a thickness no more than 30 angstroms; and
        forming a second silicon oxide layer having a thickness no more than 35 angstroms;
    forming a charge trapping dielectric layer between the tunneling dielectric layer and another of the word line of the plurality of word lines and the channel surface; and
    forming a blocking dielectric layer between the charge trapping dielectric layer and said another of the word line of the plurality of word lines and the channel surface.

17. An apparatus, comprising:
an integrated circuit including an array of nonvolatile memory cells, the integrated circuit comprising:
    a substrate;
    a plurality of word lines accessing the array of nonvolatile memory cells;
    a plurality of bit lines accessing the array of nonvolatile memory cells;
    a dielectric stack layer means over the substrate, the array of nonvolatile memory cells storing nonvolatile data at locations of the dielectric stack layer accessed by the plurality of word lines and the plurality of bit lines, the dielectric stack layer means continuous between adjacent word lines of the plurality of word lines of memory cells between a bit line and a source line over a region including the locations of the array of nonvolatile memory cells accessed by the plurality of word lines and the plurality of bit lines;
    implanted regions in the substrate under the dielectric stack layer, each of the implanted regions positioned between two of the plurality of word lines, including junctions having junction depths shorter than channel length of the nonvolatile memory cells, and at the junction depths the junctions have concentrations equal to a background concentration of the substrate; and
    control circuitry performing operations on the array.

18. An apparatus, comprising:
an integrated circuit including an array of nonvolatile memory cells, the integrated circuit comprising:
    a substrate;
    a plurality of word lines accessing the array of nonvolatile memory cells;
    a plurality of bit lines accessing the array of nonvolatile memory cells;
    a dielectric stack layer over the substrate, the array of nonvolatile memory cells storing nonvolatile data at locations of the dielectric stack layer accessed by the plurality of word lines and the plurality of bit lines, the dielectric stack layer continuous across the array of nonvolatile memory cells over a region including the locations of the array of nonvolatile memory cells accessed by the plurality of word lines and the plurality of bit lines;
    implanted regions in the substrate under the dielectric stack layer, the implanted regions positioned between the locations of the dielectric stack layer, including junctions having junction depths shorter than channel length of the nonvolatile memory cells, and at the junction depths the junctions have concentrations equal to a background concentration of the substrate; and
    control circuitry performing operations on the array.

* * * * *